United States Patent
Siess et al.

(10) Patent No.: US 11,476,393 B2
(45) Date of Patent: Oct. 18, 2022

(54) PHOSPHOR-CONVERTED LIGHT-EMITTING DEVICE

(71) Applicant: ams AG, Premstaetten (AT)

(72) Inventors: Gunter Siess, Premstaetten (AT); Julius Komma, Premstaetten (AT); Peter Roentgen, Premstaetten (AT); Martin Salt, Premstaetten (AT)

(73) Assignee: AMS AG, Premstätten (AT)

( * ) Notice: Subject to any disclaimer, the term of this patent is extended or adjusted under 35 U.S.C. 154(b) by 0 days.

(21) Appl. No.: 16/646,242

(22) PCT Filed: Sep. 13, 2018

(86) PCT No.: PCT/EP2018/074818
§ 371 (c)(1),
(2) Date: Mar. 11, 2020

(87) PCT Pub. No.: WO2019/057611
PCT Pub. Date: Mar. 28, 2019

(65) Prior Publication Data
US 2020/0274035 A1 Aug. 27, 2020

(30) Foreign Application Priority Data
Sep. 19, 2017 (EP) ..................... 17191858

(51) Int. Cl.
*H01L 33/50* (2010.01)
*H01L 33/46* (2010.01)
*H01L 33/58* (2010.01)

(52) U.S. Cl.
CPC ............ *H01L 33/502* (2013.01); *H01L 33/46* (2013.01); *H01L 33/58* (2013.01)

(58) Field of Classification Search
CPC ........ H01L 33/502; H01L 33/46; H01L 33/58
See application file for complete search history.

(56) References Cited

U.S. PATENT DOCUMENTS 5,813,753 A * 9/1998 Vriens ................... H01L 33/502
257/13
2008/0023719 A1* 1/2008 Camras .................. H01L 33/62
257/98

(Continued)

FOREIGN PATENT DOCUMENTS

| CN | 101216611 A | 7/2008 |
| CN | 103843163 A | 6/2014 |

(Continued)

OTHER PUBLICATIONS

Jurgen Roither et al, Highly efficient (infra)red conversion of InGaN light emitting diodes by nanocrystals, enhanced by colour selective mirrors, 2008 Nanotechnology 19 355205 (Year: 2008).*

(Continued)

*Primary Examiner* — Mark W Tornow
(74) *Attorney, Agent, or Firm* — MH2 Technology Law Group LLP

(57) ABSTRACT

A phosphor-converted light-emitting device comprising an emitter device configured to emit a spectrum of electromagnetic radiation, a conversion layer comprising at least one phosphor, the conversion layer being configured to convert electromagnetic radiation of the spectrum into electromagnetic radiation of a different further spectrum, and a blocking layer configured to attenuate electromagnetic radiation outside the further spectrum, the conversion layer being arranged between the emitter device and the blocking layer.

9 Claims, 1 Drawing Sheet

(56) References Cited

U.S. PATENT DOCUMENTS

| | | | |
|---|---|---|---|
| 2010/0085758 A1* | 4/2010 | Takahashi | G02B 5/289 |
| | | | 362/293 |
| 2010/0090235 A1 | 4/2010 | Wang et al. | |
| 2010/0320480 A1 | 12/2010 | Rapoport et al. | |
| 2011/0220953 A1* | 9/2011 | Bechtel | H01L 33/46 |
| | | | 257/98 |
| 2015/0034990 A1* | 2/2015 | Roitman | H01L 33/46 |
| | | | 257/98 |
| 2015/0137164 A1* | 5/2015 | Ichikawa | H01L 33/005 |
| | | | 257/98 |
| 2019/0259916 A1* | 8/2019 | Iwakura | C09K 11/7734 |

FOREIGN PATENT DOCUMENTS

| | | |
|---|---|---|
| DE | 102006046199 | 4/2008 |
| EP | 2833422 | 2/2015 |
| TW | 200830591 A | 7/2008 |
| TW | 200945634 A | 11/2009 |

OTHER PUBLICATIONS

European Patent Office, International Search Report for PCT/EP2018/074818 dated Dec. 12, 2018.

\* cited by examiner

PHOSPHOR-CONVERTED LIGHT-EMITTING DEVICE

The present disclosure applies to the field of phosphor-converted light-emitting devices, in particular near-infrared light-emitting devices.

BACKGROUND OF THE INVENTION

Phosphor-converted light-emitting devices include an emitter of a spectrum of electromagnetic radiation and are coated with at least one phosphor, i.e., a substance exhibiting the phenomenon of luminescence. A fraction of the spectrum is transformed by the phosphor to radiation of longer wavelengths. By the use of phosphors of different colors, a broad emission spectrum can be obtained. Phosphor-converted LEDs are especially used to generate white light.

A relatively small fraction of the intensity of the initial radiation is converted, so that the application of the converted radiation may adversely be affected by radiation of the initial spectrum. In this case filters may be required to absorb the undesired wavelengths of the initial spectrum.

An interference filter is formed by a plurality of thin layers of dielectric materials having different refractive indices. Owing to constructive and destructive interference at these layers, larger or smaller fractions of incident electromagnetic radiation are transmitted and reflected, depending on the wavelength. The interference filter functions as a dielectric mirror or Bragg mirror for wavelengths for which the interference is totally destructive in the forward direction of propagation.

SUMMARY OF THE INVENTION

The definitions as described above also apply to the following description unless stated otherwise.

The phosphor-converted light-emitting device comprises an emitter device for the emission of a spectrum of electromagnetic radiation, a conversion layer comprising at least one phosphor, and a blocking layer. The conversion layer is arranged between the emitter device and the blocking layer and is configured to convert electromagnetic radiation of the spectrum into electromagnetic radiation of a different further spectrum. The blocking layer attenuates electromagnetic radiation outside the further spectrum.

In embodiments of the phosphor-converted light-emitting device, the blocking layer is an interference filter or a Bragg mirror. The blocking layer may also comprise a metal layer.

In further embodiments, the blocking layer reflects electromagnetic radiation emitted by the emitter device to the conversion layer and thus enhances an intensity of electromagnetic radiation of the further spectrum.

Further embodiments comprise a carrier transparent for electromagnetic radiation of the further spectrum. The blocking layer is applied to the carrier and arranged between the carrier and the conversion layer. The carrier may especially be a glass substrate.

Further embodiments comprise a lens arranged on the carrier above the emitter device, the lens being transparent for electromagnetic radiation of the further spectrum.

Further embodiments comprise a housing forming a cavity. The emitter device and the conversion layer are arranged in the cavity, and the blocking layer covers the cavity. The blocking layer may instead be applied on the conversion layer.

BRIEF DESCRIPTION OF THE DRAWINGS

The following is a detailed description of examples of the phosphor-converted light-emitting device in conjunction with the appended figures.

DETAILED DESCRIPTION

Figure 1:
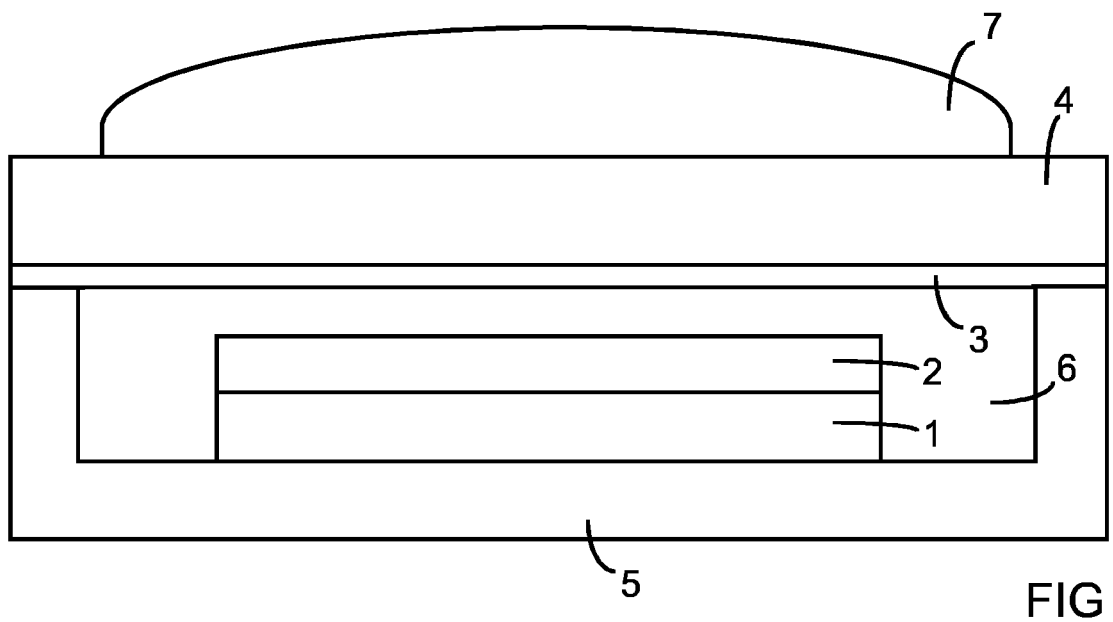
FIG. 1 is a cross section of an embodiment of the phosphor-converted light-emitting device.

FIG. 1 is a cross section of an embodiment of the phosphor-converted light-emitting device. It comprises an emitter device 1, which may be a light-emitting diode, for instance. The emitter device 1 is configured to emit electromagnetic radiation and is provided with a conversion layer 2, which comprises at least one phosphor. In different embodiments of the phosphor-converted light-emitting device, the conversion layer 2 may be formed by a single layer or by a plurality of partial layers comprising different phosphors. The conversion layer 2 is configured to convert electromagnetic radiation of the spectrum emitted by the emitter device 1 into electromagnetic radiation of a different further spectrum.

The radiation emitted by the emitter device 1 is used to stimulate the radiation conversion by the conversion layer 2. The output of the phosphor-converted light-emitting device is radiation of the further spectrum.

A blocking layer 3 is arranged above the conversion layer 2. The blocking layer 3 is configured to attenuate electromagnetic radiation outside the further spectrum. The attenuation may even result in a total shielding of radiation for some wavelengths or for a range of wavelengths. The blocking layer 3 may be an interference filter formed by dielectric layers of different indices of refraction. The blocking layer 3 may be a dielectric mirror or Bragg mirror. The blocking layer 3 may also comprise a metal layer, for instance.

The blocking layer 3 may be applied to a carrier 4, which is transparent for electromagnetic radiation of the further spectrum. The carrier 4 may be a glass substrate, for instance.

In the embodiment according to FIG. 1, the blocking layer 3 and the carrier 4 cover a cavity 6 of a housing 5, which forms a package of the device. The remaining volume of the cavity 6 may be filled with a molding compound that is also transparent for electromagnetic radiation of the further spectrum. A lens or another optical element that is transparent for electromagnetic radiation of the further spectrum may be arranged on the carrier 4 above the emitter device 1. The carrier 4 and the lens 7 are optional.

Figure 2:
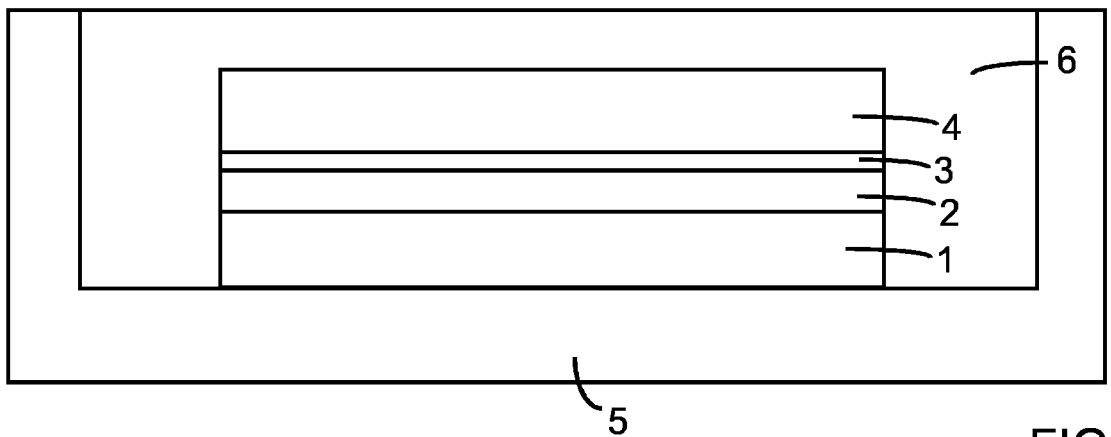
FIG. 2 is a cross section of a further embodiment.

FIG. 2 is a cross section of a further embodiment comprising an emitter device 1, a conversion layer 2, a blocking layer 3 applied to a carrier 4, and a housing 5 with a cavity 6 accommodating the emitter device 1. In the further embodiment according to FIG. 2, the blocking layer 3 is directly applied on the conversion layer 2 and thus arranged inside the cavity 6. This embodiment may also be provided with a lens or another optical element that is transparent for electromagnetic radiation of the further spectrum.

Figure 3:
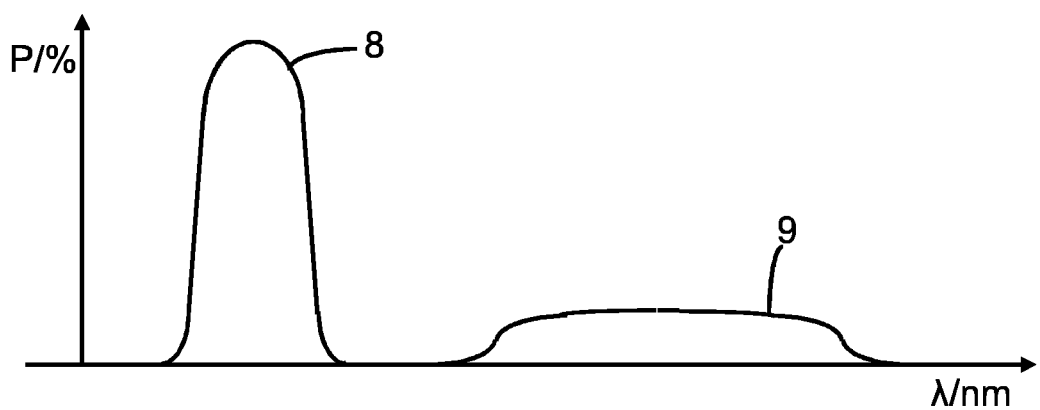
FIG. 3 is a diagram showing a spectrum and a further spectrum.

FIG. 3 is a diagram of a spectrum 8 and a further spectrum 9 of electromagnetic radiation. The diagram shows the relative power P as a function of the wavelength A. The spectrum 8 is an example of a spectrum emitted by the emitter device 1. The spectrum 8 may include a principal colour, which is schematically indicated in the diagram of FIG. 3 by the peak of the left curve. If the emitter device 1 comprises a blue LED, for instance, the principal colour is blue. The spectrum 8 is converted by the phosphor or phosphors of the conversion layer 2 into the further spectrum 9 of longer wavelengths A. Blue light, for instance, may be converted to yellow light by a yellow phosphor, by way of example.

As the desired output of the phosphor-converted light-emitting device is in the range of the further spectrum 9, the emission of radiation having wavelengths of the spectrum 8 is preferably inhibited or at least reduced. This is effected according to an aspect of the invention by the blocking layer 3, which can be configured to shield the entire spectrum 8 or at least a part thereof. The emission in the remaining further spectrum 9 may be enhanced by the blocking of the spectrum 8.

The blocking layer 3 may be configured as an interference filter or as a Bragg mirror, for instance. A Bragg mirror can especially be designed to prevent any transmission of a principal wavelength or range of wavelengths, which may be blue light emitted by a blue LED, for instance. By means of the blocking layer 3, the output of the phosphor-converted light-emitting device in the further spectrum 9, which includes the desired range of wavelengths of the converted radiation, is substantially improved, while the intensity of the radiation in the spectrum 8 of the emitter device 1, which is not intended for output, can effectively be reduced. Radiation reflected by the blocking layer 3 into the conversion layer 2 may provide a further stimulation of the conversion, so that the desired output is enhanced.

The described phosphor-converted light-emitting device is especially suitable to generate light in the near-infrared range, which is mostly needed for spectral analyses.

The invention claimed is:

1. A phosphor-converted light-emitting device, comprising:
    an emitter device configured to emit a spectrum of electromagnetic radiation,
    a conversion layer comprising at least one phosphor, the conversion layer being configured to convert electromagnetic radiation of the spectrum into electromagnetic radiation of a different further spectrum,
    a blocking layer configured to attenuate electromagnetic radiation outside the further spectrum, the conversion layer being arranged between the emitter device and the blocking layer, the blocking layer being arranged spaced apart from the conversion layer, and the light-emitting device being configured to emit electromagnetic radiation of the further spectrum at a side of the light-emitting device where the blocking layer is arranged,
    a carrier transparent for electromagnetic radiation of the further spectrum, the blocking layer being applied to the carrier and arranged between the carrier and the conversion layer, and
    a housing forming a cavity, the emitter device and the conversion layer being arranged in the cavity, and the blocking layer and the carrier covering the cavity.

2. The phosphor-converted light-emitting device of claim 1, wherein the blocking layer is an interference filter.

3. The phosphor-converted light-emitting device of claim 1, wherein the blocking layer is a Bragg mirror.

4. The phosphor-converted light-emitting device of claim 1, wherein the blocking layer comprises a metal layer.

5. The phosphor-converted light-emitting device of claim 1, wherein the blocking layer reflects electromagnetic radiation emitted by the emitter device to the conversion layer and thus enhances an intensity of electromagnetic radiation of the further spectrum.

6. The phosphor-converted light-emitting device of claim 1, wherein the carrier is a glass substrate.

7. The phosphor-converted light-emitting device of claim 1, further comprising a lens arranged on the carrier above the emitter device, the lens being transparent for electromagnetic radiation of the further spectrum.

8. The phosphor-converted light-emitting device of claim 1, wherein the further spectrum includes wavelengths of near-infrared radiation.

9. A phosphor-converted light-emitting device, comprising:
    an emitter device configured to emit a spectrum of electromagnetic radiation,
    a conversion layer comprising at least one phosphor, the conversion layer being configured to convert electromagnetic radiation of the spectrum into electromagnetic radiation of a different further spectrum,
    a blocking layer configured to attenuate electromagnetic radiation outside the further spectrum, the conversion layer being arranged between the emitter device and the blocking layer, the blocking layer being arranged spaced apart from the conversion layer, a distance between the blocking layer and the conversion layer being smaller than a thickness of the emitter device, and the light-emitting device being configured to emit electromagnetic radiation of the further spectrum at a side of the light-emitting device where the blocking layer is arranged,
    a carrier transparent for electromagnetic radiation of the further spectrum, the blocking layer being applied to the carrier and arranged between the carrier and the conversion layer, and
    a housing forming a cavity, the emitter device and the conversion layer being arranged in the cavity, and the blocking layer and the carrier covering the cavity, wherein the blocking layer reflects electromagnetic radiation emitted by the emitter device to the conversion layer and thus enhances an intensity of electromagnetic radiation of the further spectrum.

* * * * *